United States Patent
Chong et al.

Patent Number: 6,127,707
Date of Patent: Oct. 3, 2000

[54] SEMICONDUCTOR DEVICE AND METHOD OF FABRICATING THE SAME

[75] Inventors: Kyu-Chul Chong; Heon-Jong Shin, both of Seoul, Rep. of Korea

[73] Assignee: Samsung Electronics Co., Ltd., Suwon, Rep. of Korea

[21] Appl. No.: 09/223,173

[22] Filed: Dec. 30, 1998

[30] Foreign Application Priority Data

Dec. 31, 1997 [KR] Rep. of Korea ............... 97-80539

[51] Int. Cl.[7] .................. H01L 27/10; H01L 29/76; H01L 29/94; H01L 31/062; H01L 31/113
[52] U.S. Cl. .................. 257/384; 257/203; 257/204; 257/377; 257/382
[58] Field of Search .................. 257/69, 203–205, 257/377, 382–384

[56] References Cited

U.S. PATENT DOCUMENTS

| | | | |
|---|---|---|---|
| 4,215,322 | 7/1980 | Iwanami | 331/116 |
| 4,654,548 | 3/1987 | Tanizawa et al. | 307/450 |
| 4,777,150 | 10/1988 | Deneuville et al. | |
| 5,119,160 | 6/1992 | Hall | 257/274 |
| 5,294,822 | 3/1994 | Verrett | 257/368 |
| 5,478,761 | 12/1995 | Komori et al. | 437/34 |
| 5,621,232 | 4/1997 | Ohno | 257/288 |
| 5,739,573 | 4/1998 | Kawaguchi | 257/384 |
| 5,818,092 | 10/1998 | Bai et al. | 257/388 |
| 5,874,342 | 2/1999 | Tsai et al. | 438/301 |

FOREIGN PATENT DOCUMENTS

0 459 773 A2  5/1991  European Pat. Off. .

*Primary Examiner*—David Hardy
*Assistant Examiner*—Allan R. Wilson
*Attorney, Agent, or Firm*—Jones Volentine, LLC

[57] ABSTRACT

A semiconductor device and a fabricating method thereof are provided. In the semiconductor device, active regions of first and second conductivity types are formed on a semiconductor substrate, apart from each other by a predetermined distance, and a silicide layer is formed on the active regions, for connecting the active regions to one another. By forming an offset area between active regions or gates of opposite conductivity types to space them from each other by a predetermined distance, there exists no area having an increased dopant concentration and a reliable silicidation is ensured.

5 Claims, 7 Drawing Sheets

SEMICONDUCTOR DEVICE AND METHOD OF FABRICATING THE SAME

CROSS-REFERENCES TO RELATED APPLICATIONS

The present application claims priority under 35 U.S.C. §119 to Korean Patent Application No. 97-80539 filed on Dec. 31, 1997, the entire contents of which are hereby incorporated by reference.

BACKGROUND OF THE INVENTION

1. Field of the Invention

The present invention relates to a semiconductor device, and in particular, to a semiconductor device in which an offset area is formed between an $N^+$ active region and a $P^+$ active region or between an $N^+$ gate and a $P^+$ gate in order to prevent unreliable silicidation caused by an increased dopant concentration, and a method of fabricating the same.

2. Description of the Related Art

Along with development of semiconductor devices towards high integration, high performance, and low voltage operation, a low-resistance gate and a new metalization technique for metal interconnection are required to reduce the gate length of a transistor and a memory cell through formation of fine patterns and improve device characteristics. The thickness of a gate insulating layer becomes smaller to increase a channel current in a transistor and a memory cell for low voltage operation. Further, in order to prevent short channel effect caused by the decrease in the gate length of a transistor and ensure a margin against punchthrough, the junction depth of source/drain regions should be small and the parasitic resistance, that is, surface resistance and contact resistance of the source/drain regions, should be reduced.

Under these circumstances, a self-aligned silicide (salicide) process is used as a new metalization technique, in which a silicide is formed on the surfaces of a gate and source/drain regions in order to reduce the resistivity of the gate and the sheet and contact resistance of the source/drain regions. The salicide process refers to selective formation of a silicide such as titanium silicide (TiSix) on a gate electrode and source/drain regions. Such a silicide is receiving considerable attention as a new metalization material because of (1) low resistance like a metal; (2) stable characteristics at high temperature; (3) easy pattern formation in a silicon layer or a polysilicon layer; (4) excellent mechanical stability such as good adherence and low stress; (5) unwillingness to react with a final metal layer; (6) low contact resistance; and (7) no contamination in wafer using equipment.

Such suicides include titanium silicide ($TiSi_2$), cobalt silicide ($CoSi_2$), and tantalum silicide ($TaSi_2$). Among them, titanium silicide is widely used in that it is stably formed because it allows an interstitial native oxide film between the titanium silicide and a polysilicon layer to be dissolved, exhibits an excellent thermal stability and a low resistance, and can be selectively formed between a gate and source/drain regions. However, a problem with formation of the titanium silicide is that overgrown titanium silicide remains along the surface of spacers formed on the sidewalls of the gate, resulting in an electrical short between the gate and the source/drain regions. Also, discontinuity of the titanium silicide may take place during a subsequent high-temperature thermal treatment.

FIGS. 1 to 4 are sectional views sequentially illustrating a method of fabricating a semiconductor device, here confined to a P-well region, with use of a conventional salicide process.

Figure 1:
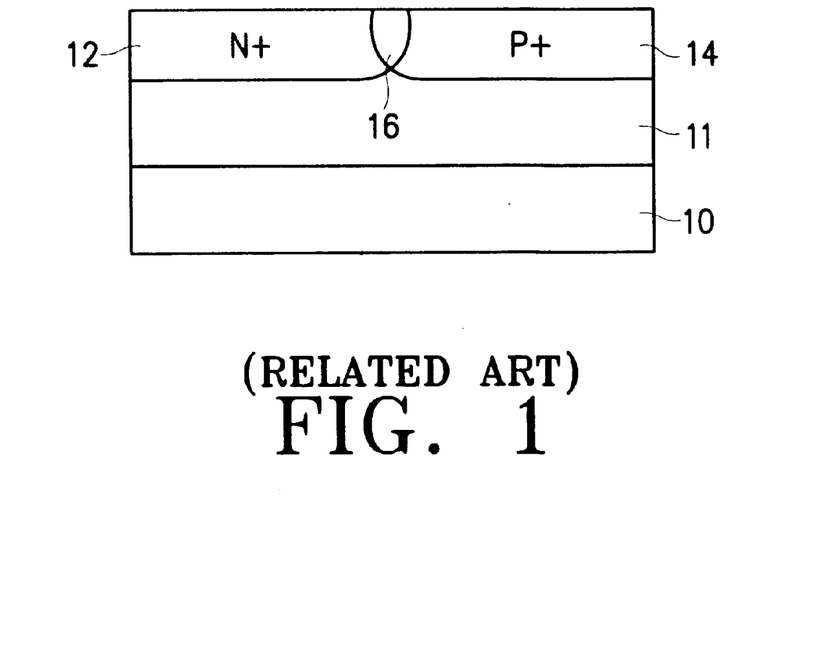
FIGS. 1 to 4 are sectional views sequentially illustrating a conventional semiconductor device fabricating method.

Referring to FIG. 1, an N-well (not seen) is formed by ion-implanting an N-type dopant into the surface of an N-or P-semiconductor substrate 10 by photolithography and ion-implantation and diffusing the N-type dopant to an intended depth by high-temperature thermal treatment. Then, a P-well 11 is formed by ion-implanting a P-type dopant into the surface of the substrate 10 except for the N-well by photolithography and ion-implantation and diffusing the P-type dopant by high-temperature thermal treatment. The N-well and the P-well function to electrically isolate a PMOS transistor from an NMOS transistor on the substrate of a CMOS (Complementary Metal Oxide Semiconductor) device.

Following definition of an active region on the substrate 10 by forming a field oxide film (not seen) in a general device isolation process, a gate insulating layer (not seen) and a gate (not seen) for a transistor are sequentially formed on the surface of the substrate 10. Then, areas for forming source/drain regions of the NMOS transistor therein are opened on the P-well 11 by photolithography, and an N-type dopant is ion-irnplanted at ahigh dose, for example, at or above a dose of 1E15 ions/cm², thereby forming an $N^+$ active region 12. Thereafter, a $P^+$ active region 14 is formed by opening a well contact forming area on the P-well 11 by photolithography and then ion-implanting a P-type dopant at a high dose, for example, at or above a dose of 1E15 ions/cm². Here, the $N^+$ active region 12 overlaps with the $P^+$ active region 14 in a specific area 16 of the P-well 11 having both the $N^+$ and $P^+$ dopants ion-implanted due to misalignment involved in photolithography for forming the $N^+$ and $P^+$ active regions 12 and 14. Therefore, dopant concentration partially increases in the overlap area 16.

Though not seen, a $P^+$ active region and an $N^+$ active region are formed in an N-well region, to be provided as source/drain regions and a well contact for a PMOS transistor, respectively. Here, an overlap area is also formed between the $N^+$ and $P^+$ active regions in the N-well region, with both the $N^+$ and $P^+$ dopants ion-implanted therein.

Figure 2:
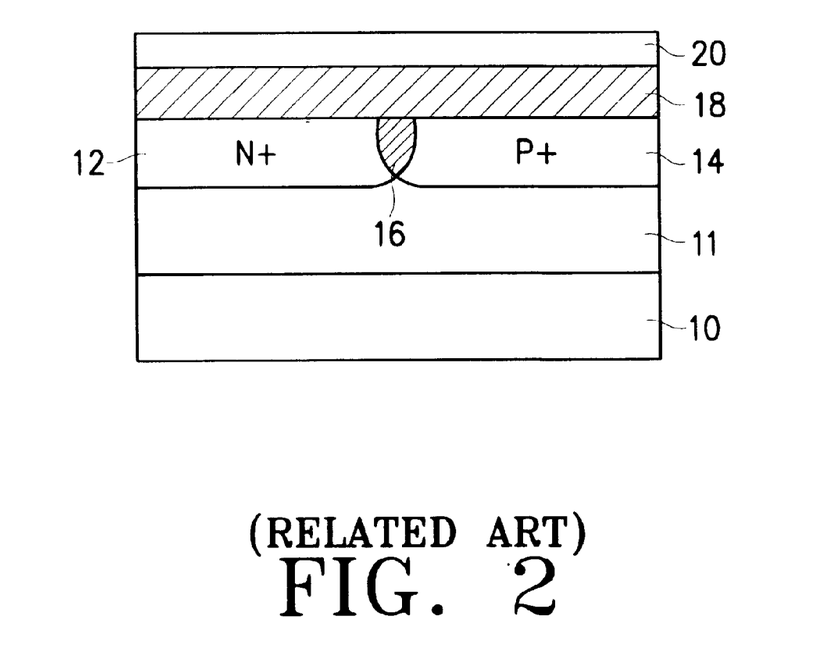

Referring to FIG. 2, a silicide forming metal layer, preferably, a titanium (Ti) layer 18 is deposited on the resultant structure having the $N^+$ and $P^+$ active regions 12 and 14 formed thereon. Then, a titanium nitride (TiN) layer 20 is formed on the titanium layer 18 to prevent oxygen contamination and dopant loss during subsequent silicidation.

Figure 3:
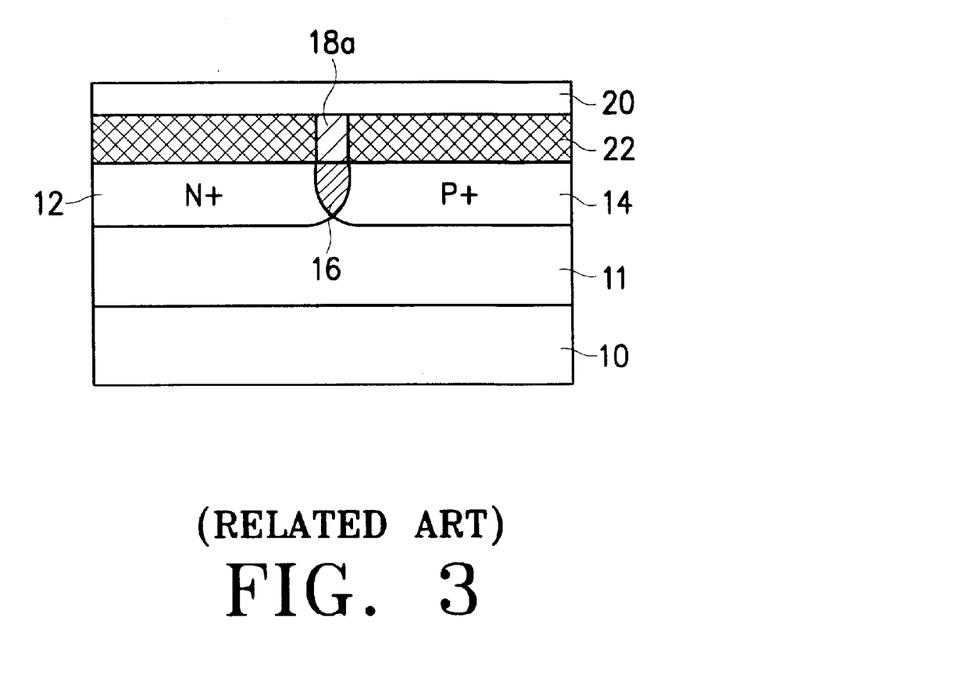

Referring to FIG. 3, silicidation is caused to take place in an area where titanium contacts silicon by RTA (Rapid Thermal Annealing) or high-temperature thermal treatment using a furnace. Thus, a titanium silicide ($TiSi_2$) layer 22 is formed on the surfaces of the exposed gate and $N^+$ and $P^+$ active regions 12 and 14. An increase in the dopant concentration of the overlap area 16 between the $N^+$ and $P^+$ active regions 12 and 14 suppresses formation of a titanium silicide and leaves unreacted titanium 18a, thereby increasing the sheet resistance of the $N^+$ and $P^+$ active regions 12 and 14. It has been reported that this is attributed to segregation or accumulation of dopants contained in silicon in excess of their solid solubility limits at the interface and the resulting prevention of silicon diffusion. The phenomenon is observed to be more serious with arsenic (As) than with phosphorous (P).

Figure 4:
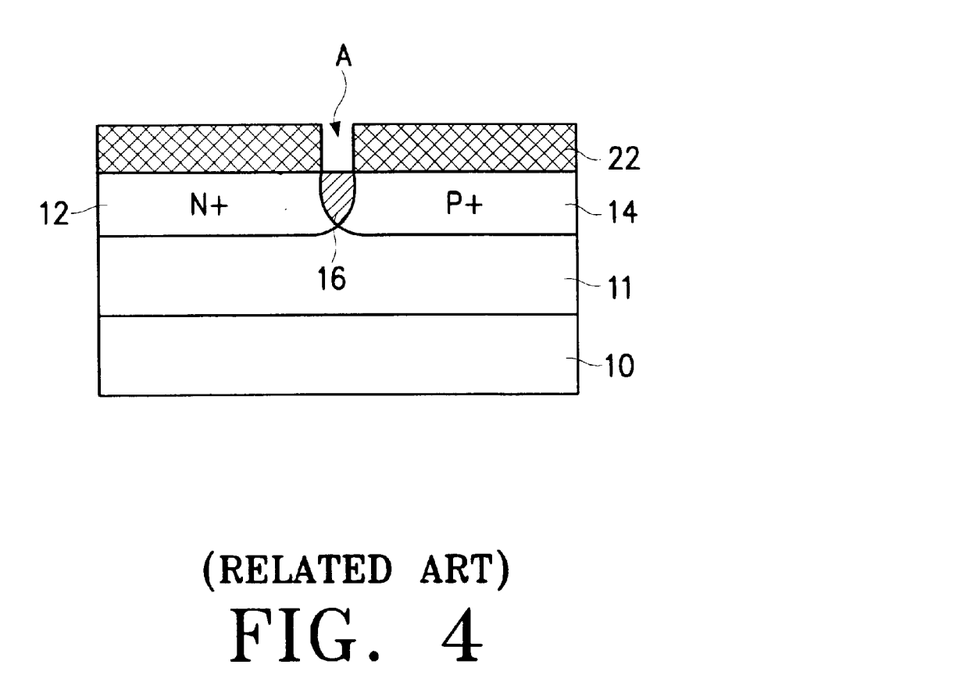

Referring to FIG. 4, the titanium nitride layer 20 and the unreacted nitride 18a are selectively removed with use of an etchant which does not damage the titanium silicide layer 22, the silicon substrate 10, and the gate insulating layer. However, no silicidation takes place or the silicide layer is broken (see area "A") in the overlap area 16 having a partially increased dopant concentration on the surface of the silicon substrate 10.

Meanwhile, an $N^+$ polysilicon layer doped with $POCL_3$ is used as a gate in both an NMOS transistor and a PMOS transistor of a general CMOS device. The NMOS transistor having the $N^+$ polysilicon gate acts in a surface channel mode, while the PMOS transistor having the $N^+$ polysilicon gate acts in a buried channel mode.

There is no problem with use of the $N^+$ polysilicon gate both for the NMOS and PMOS transistors in a device having a 0.3 µm or longer effective channel length. However, short channel effect emerges as a problem with a 0.2 µm or longer gate length required for a device of 1 or more giga bytes, especially a PMOS transistor operated in the buried channel mode. That is, because a drain voltage has a great influence on a channel in a device operated in the buried channel mode, the device is more susceptible to the short channel effect than a device operated in a surface channel mode.

Accordingly, studies have been conducted on a method of fabricating a CMOS device having a dual gate structure of an $N^+$ gate for an NMOS transistor and a $P^+$ gate for a PMOS transistor.

Figure 5:
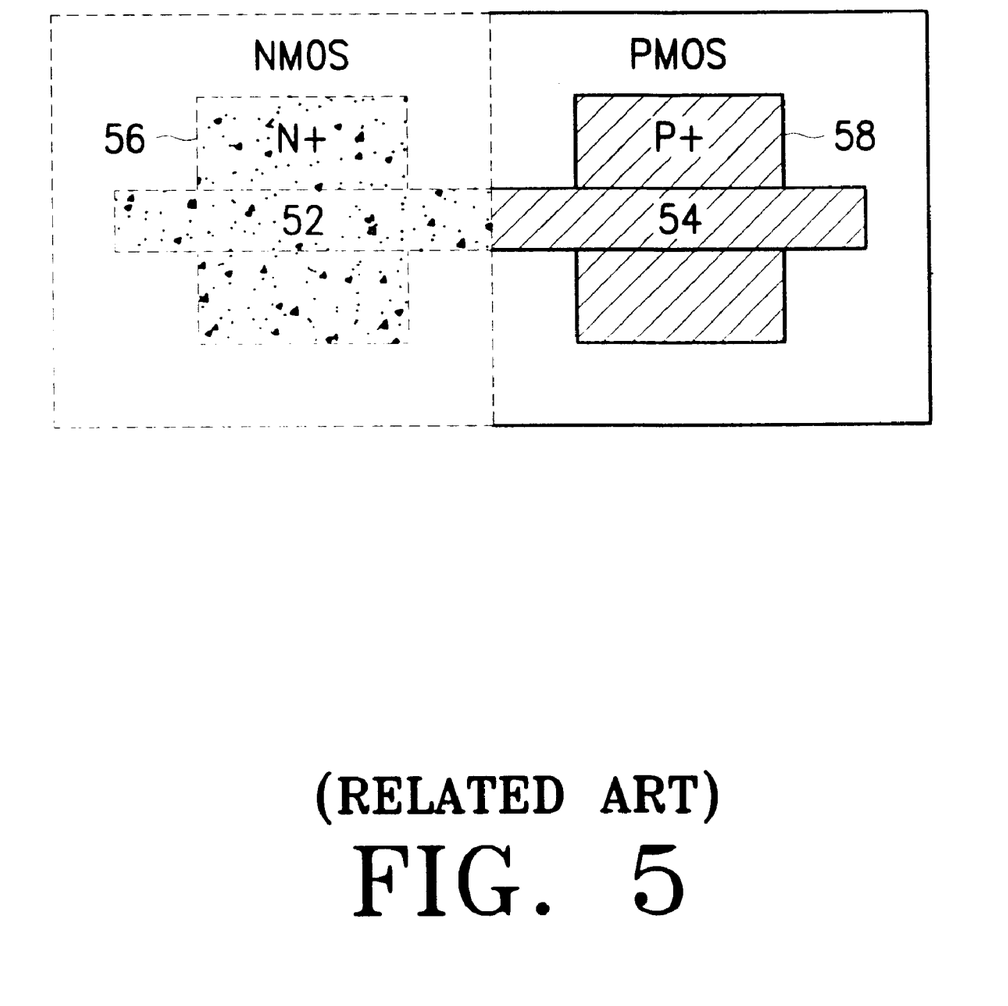
FIG. 5 is a plan view of a conventional semiconductor device having a dual gate structure.

FIG. 5 is a plan view of a conventional semiconductor device employing a dual gate structure. Here, reference numeral 52 denotes an $N^+$ gate, reference numeral 54 denotes a $P^+$ gate, reference numeral 56 denotes an $N^+$ active region, and reference numeral 58 denotes a $P^+$ active region.

Referring to FIG. 5, after a conductive layer is formed on a semiconductor substrate (not seen), the $N^+$ gate 52 is formed by ion-implanting an $N^+$ dopant into an NMOS transistor forming area by photolithography and ion-implantation. Then, the $P^+$ gate 54 is formed by implanting a $P^+$ dopant into a PMOS transistor forming area by photolithography and ion-implantation. Here, since the $N^+$ gate 52 is in contact with the $P^+$ gate 54, a threshold voltage may shift due to inter-diffusion between the $N^+$ and $P^+$ dopants during subsequent thermal treatment. In addition, misalignment involved in photolithography for forming the $N^+$ and $P^+$ gates 52 and 54 may lead to existence of an area having both the $N^+$ and $P^+$ dopants ion-implanted therein. Therefore, a dopant concentration increases in this area, which impedes reliable silicidation, damages a silicide layer, and thus markedly increases the sheet resistance of the gates.

Figure 6A:
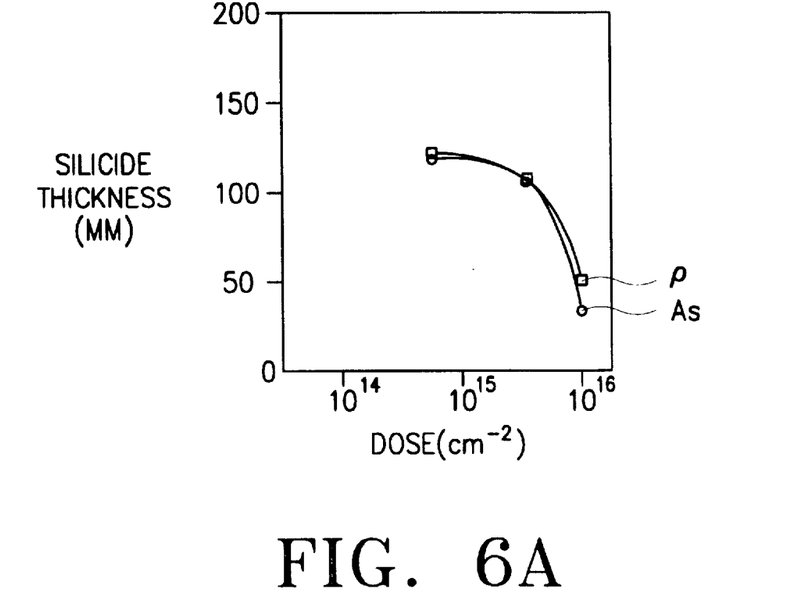
FIGS. 6A and 6B are graphs of the thickness and sheet resistance of a titanium silicide with respect to a dopant dose in a polysilicon layer at 600° C., respectively.
Figure 6B:
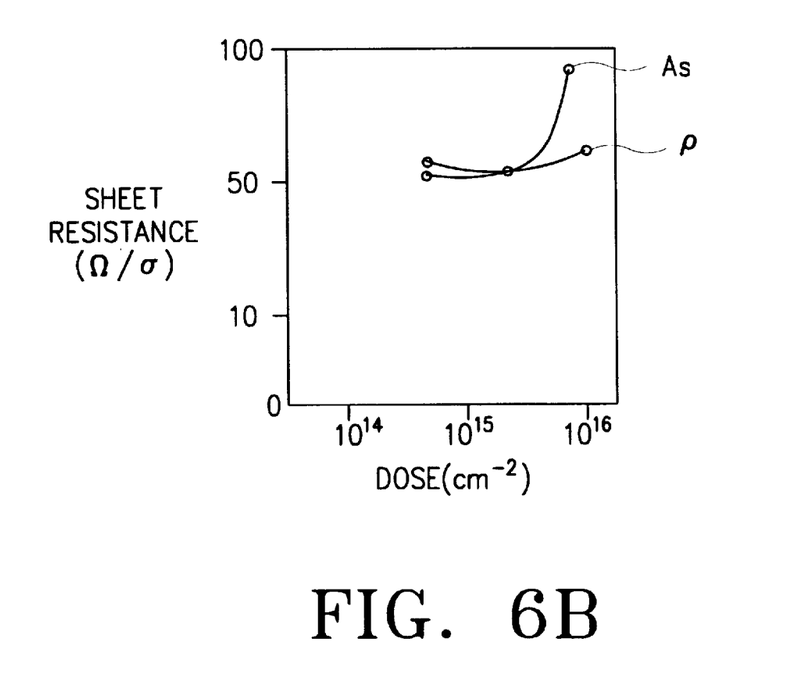

FIGS. 6A and 6B are graphs of the thickness and sheet resistance, respectively, of a titanium silicide with respect to the dose of a dopant in polysilicon at 600° C. Here, ○ represents use of arsenic as a dopant, and □ represents use of phosphorous as a dopant.

From FIGS. 6A and 6B, it is noted that with the increase in the dopant dose of a polysilicon layer, dopants contained in silicon in excess of their solid solubility limits are segregated or piled up at the interface, thereby blocking diffusion of silicon. Thus, a titanium silicide is not reliably formed and its sheet resistance is increased. This phenomenon is observed to be more serious with arsenic than with phosphorous.

SUMMARY OF THE INVENTION

The present invention is therefore directed to a semiconductor device and method of forming the same which substantially overcomes one or more of the problems due to the limitations and disadvantages of the related art.

An object of the present invention is to provide a semiconductor device in which an offset area is formed between an $N^+$ active region and a $P^+$ active region in order to prevent unreliable silicidation caused by an increased dopant concentration, and a method of fabricating the same.

Another object of the present invention is to provide a semiconductor device having a dual gate structure in which an offset area is formed between an $N^+$ active region and a $P^+$ active region in order to prevent unreliable silicidation caused by an increased dopant concentration, and a method of fabricating the same.

To achieve the above and other objects, there is provided a semiconductor device. In the semiconductor device, a first silicon element doped with n-type dopants and a second silicon element doped with p-type dopants are formed on a surface of a semiconductor substrate. The first and second silicon elements are spaced apart from each other by a third silicon element. A silicide layer is formed on the first and third silicon elements, thereby connecting the first and second silicon elements.

The third silicon element may be formed of non-doped silicon. Alternatively, the third silicon element may be formed of a silicon doped with one of n-type and p-type dopants having a doping level lower than that of one of the first and second silicon elements. The first and second silicon elements may serve as a gate of a transistor. The third silicon element may serve as a well having the first and second silicon elements formed thereon.

According to another aspect of the present invention to achieve the above and other objects, there is provided a method of fabricating a semiconductor device. In the method, an active region of a first conductivity type is formed by opening a first area on a semiconductor substrate by photolithography and then ion-implanting a dopant of the first conductivity type. An active region of a second conductivity type and an offset area between the active regions of the first and second conductivity types are formed by opening a second area apart from the first area by a predetermined distance by photolithography and then ion-implanting a dopant of the second conductivity type. A metal layer is formed on the resultant structure.

Before forming an active region of a first conductivity type, a well of the first conductivity type may be formed in a third area of the semiconductor substrate, including the first and second areas, to have a doping level lower than that of one of the active regions of the first and second conductivity types.

Alternatively, before forming an active region of a first conductivity type, a well of the second conductivity type may be formed in a third area of the semiconductor substrate, including the first and second areas, to have a doping level lower than that of one of the active regions of the first and second conductivity types.

Before forming an active region of a first conductivity type, a gate insulating layer and a gate for a transistor may be sequentially formed on the semiconductor substrate.

When forming a metal layer, preferably a metal barrier layer is formed on the metal layer. Preferably, the metal layer is formed of titanium (Ti) and the metal barrier layer is formed of titanium nitride (TiN).

According to still another aspect of the present invention to achieve the above and other objects, there is provided a method of fabricating a semiconductor device having a dual gate structure in which a device of a first conductivity type has a gate of the first conductivity type, and a device of a second conductivity type has a gate of the second conductivity type. In this method, a silicon layer for forming a gate is formed on a semiconductor substrate. The gate of the first conductivity type is formed by opening a first area of the semiconductor substrate by photolithography and then ion-implanting a dopant of the first conductivity type into the exposed silicon layer. The gate of the second conductivity type and an offset area between the gates of the first and second conductivity types is formed by opening a second area apart from the first area by a predetermined distance by photolithography and then ion-implanting a dopant of the second conductivity type into the exposed silicon layer. A metal layer is formed on the resultant structure, and a silicide layer is formed on the surfaces of the exposed gates of the first and second conductivity types and the offset area by thermally treating the metal layer.

Preferably, the silicon layer is formed of one of polysilicon, amorphous silicon, and single crystalline silicon.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements.

Figure 7:
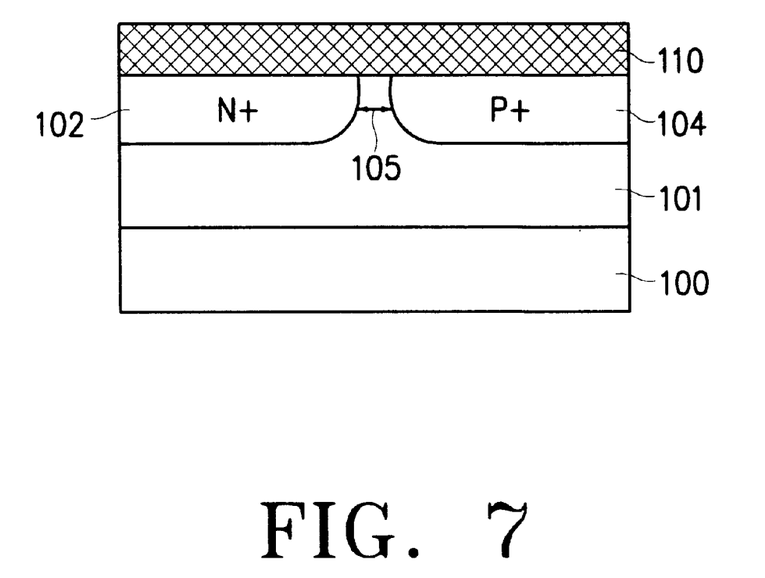
FIG. 7 is a sectional view of a semiconductor device according to an embodiment of the present invention.

FIG. 7 is a sectional view of a semiconductor device, here confined to a P-well region, according to an embodiment of the present invention.

Referring to FIG. 7, an $N^+$ active region 102 and a $P^+$ active region 104 are formed as source/drains and a P-well contact for an NMOS transistor, respectively, over a P-well 101 on the surface of an N-or P-semiconductor substrate 100. An offset area 105 is formed between the $N^+$ and $P^+$ active regions 102 and 104 to space them from each other by a predetermined distance. A titanium silicide layer 110 is reliably formed on the $N^+$ and $P^+$ active regions 102 and 104 and the offset area 105. Silicidation takes place on the overall surface of the active regions because with no ion-implantation of the $N^+$ and $P^+$ dopants in the offset area 105, there exists no area having an increased dopant concentration.

Though not seen, $P^+$ and $N^+$ active regions are formed in an N-well region as a source/drain and a well contact for a PMOS transistor, respectively, and an offset area is formed between the $N^+$ and $P^+$ active regions.

FIGS. 8 to 11 are sectional views sequentially illustrating a method of fabricating the device shown in FIG. 7.

Figure 8:
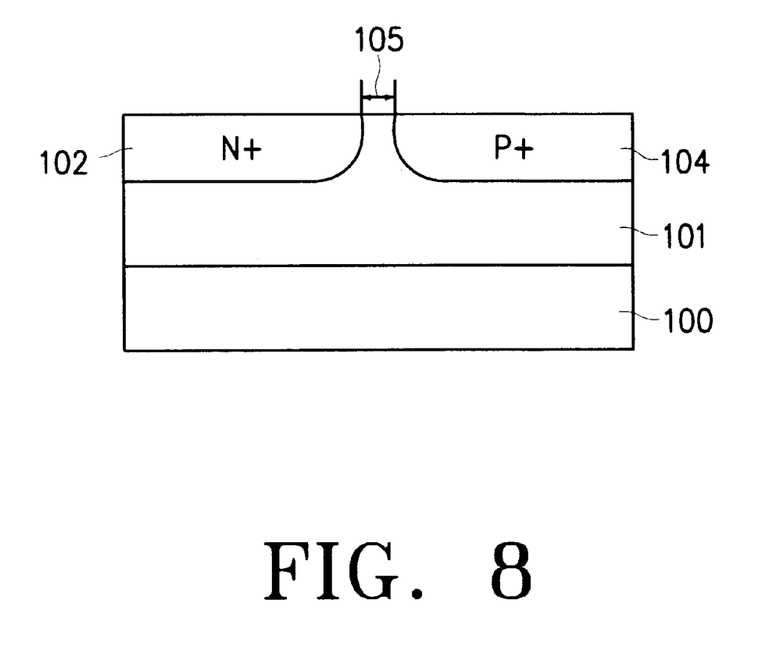
FIGS. 8 to 11 are sectional views sequentially illustrating a process of fabricating the device shown in FIG. 7.

FIG. 8 illustrates the formation of the offset area 105. An N-well (not seen) is formed by ion-implanting an N-type dopant into the surface of an N-or P-semiconductor substrate 100 by photolithography and ion-implantation and diffusing the N-type dopant to an intended depth by high-temperature thermal treatment. Then, the P-well 101 is formed by ion-implanting a P-type dopant into the surface of the substrate 100 except for the N-well by photolithography and ion-implantation and diffusing the P-type dopant by high-temperature thermal treatment.

After an active region is defined on the substrate 100 by forming a field oxide film (not seen) in a general device isolation process, a gate insulating layer (not seen) and a gate (not seen) for a transistor are sequentially formed on the surface of the substrate 100. Then, a first area for forming a source/drain of an NMOS transistor therein is opened on the P-well 101 by photolithography, and an N-type dopant is ion-implanted at a high dose, for example, at or above a dose of $1E15$ ions/cm$^2$, thereby forming the $N^+$ active region 102. Thereafter, the $P^+$ active region 104 is formed by opening a second area for forming a well contact therein on the P-well 101 by photolithography and then ion-implanting a P-type dopant at a high dose, for example, at or above a dose of $1E15$ ions/cm$^2$. Here, the second area is spaced from the first area during the photolithography for opening the second area by a predetermined distance so that the offset area 105 can be formed between the $N^+$ active region 102 and the $P^+$ active region 104.

Though not seen, a $P^+$ active region and an $N^+$ active region are formed in the N-well region, to be provided as a source/drain and a well contact for a PMOS transistor, respectively. Here, an offset area is also formed between the $N^+$ and $P^+$ active regions in the N-well region.

Figure 9:
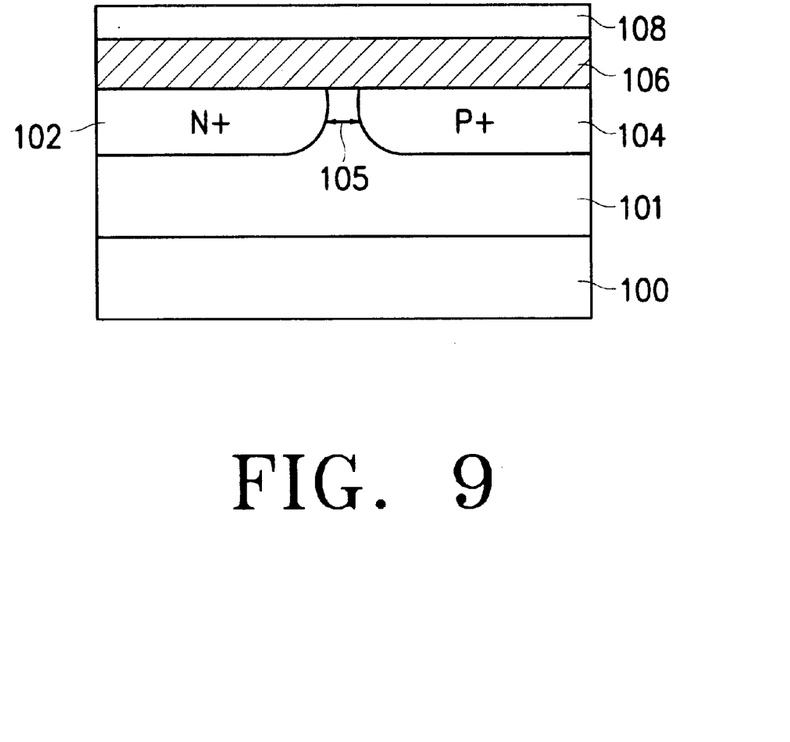

FIG. 9 illustrates the formation of a titanium layer 106 and a titanium nitride layer 108. After the formation of the $N^+$ active region 102, the $P^+$ active region 104, and the offset area 105, a silicide forming metal layer, preferably, the titanium layer 106 is deposited on the resultant structure. Then, the titanium nitride layer 108 is formed on the titanium layer 106, as a metal barrier layer to prevent oxygen contamination and dopant loss during subsequent silicidation.

Figure 10:
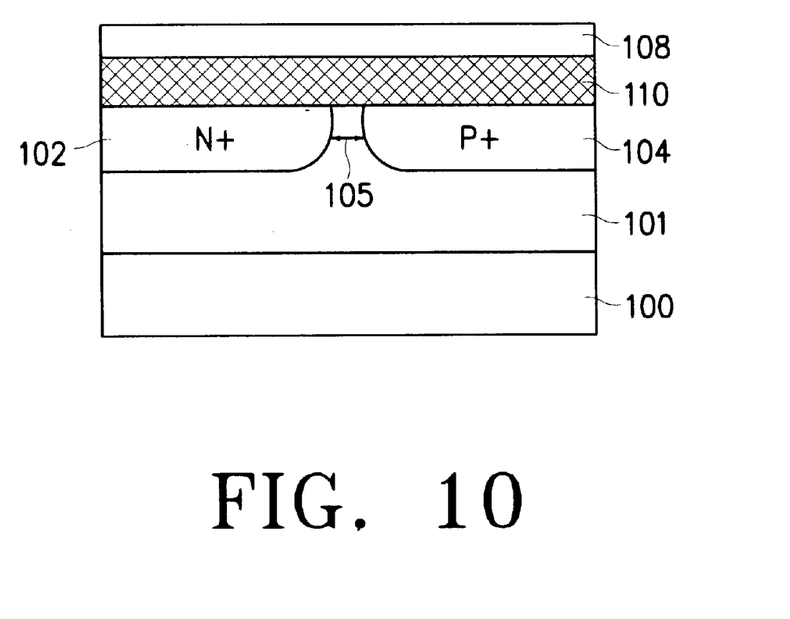

FIG. 10 illustrates the formation of the titanium silicide layer 110. After the formation of the titanium nitride layer 108, silicidation is caused to take place in an area where titanium contacts silicon by performing RTA or high-temperature thermal treatment using a furnace on the overall surface of the resultant structure. Thus, the titanium silicide layer 110 is formed on the surfaces of an exposed gate, $N^+$ and $P^+$ active regions 102 and 104, and offset area 105. Here, with no ion-implantation of the $N^+$ and $P^+$ dopants into the offset area 105, there exists no area having an increased dopant concentration. Thus, silicidation takes place on the overall surface of the regions where titanium contacts silicon.

Figure 11:
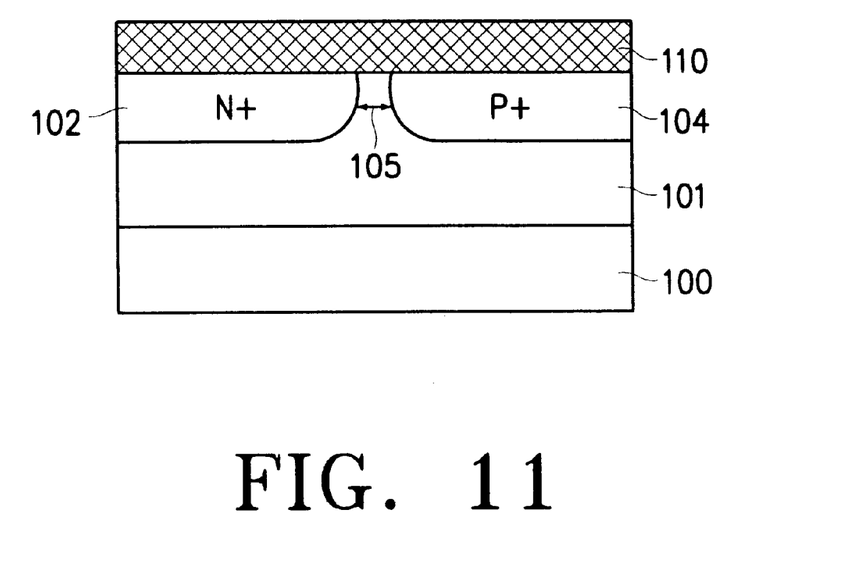

FIG. 11 illustrates the selective stripping of the titanium nitride layer 108 and the unreacted titanium, using an etchant which does not damage the titanium silicide layer 110, the silicon substrate 100, and the gate insulating layer. According to the present invention, silicidation takes place overall of the active region because of the presence of the offset area 105 between the $N^+$ active region 102 and the $P^+$ active region 104. Thus, the titanium silicide layer 110 is present on the overall surface of the active regions after the stripping.

Figure 12:
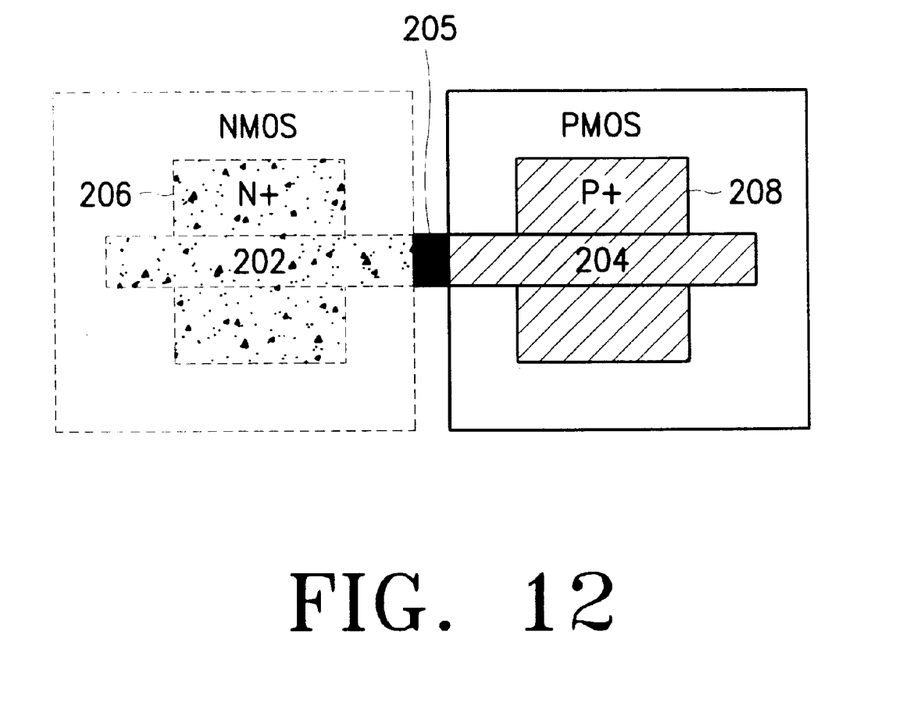
FIG. 12 is a plan view of a semiconductor device having a dual gate structure according to another embodiment of the present invention.

FIG. 12 is a plan view of a semiconductor device having a dual gate structure according to another embodiment of the present invention.

Referring to FIG. 12, an $N^+$ gate 202 of an NMOS transistor is spaced from a $P^+$ gate 204 of a PMOS transistor by a predetermined distance in the dual gate structure of the present invention. That is, an offset area 205, which experiences no ion-implantation of both $N^+$ and $P^+$ dopants, is interposed between the $N^+$ gate 202 and the $P^+$ gate 204.

There will hereinbelow be given a description of a method of fabricating the above dual gate structure. The processes not described in detail are analogous to those discussed above regarding the corresponding portions of the structure in FIG. 7.

A conductive layer for a gate is formed of polysilicon, amorphous silicon, or single crystalline silicon on a semiconductor substrate. Then, after a first area for forming the NMOS transistor therein is opened by photolithography, an $N^+$ dopant is ion-implanted into the exposed conductive layer, thereby forming the $N^+$ gate 202. Subsequently, the $P^+$ gate 204 is formed by opening a second area for forming the PMOS transistor therein by photolithography, apart from the first area by a predetermined distance, and then ion-implanting a $P^+$ dopant into the exposed conductive layer. Thus, the offset area 205 having neither $N^+$ dopant nor $P^+$ dopant ion-implanted therein is formed between the $N^+$ gate 202 and the $P^+$ gate 204.

Thereafter, an $N^+$ active region 206 is formed in self-alignment with the $N^+$ gate 202 in the NMOS transistor region by photolithography and ion-implantation, and a $P^+$ active region 208 is formed in self-alignment with the $P^+$ gate 204 in the PMOS transistor region.

Though not seen, preferably a titanium layer is deposited as a silicide forming metal layer on the resultant structure, and silicidation is caused to take place in an area where titanium contacts silicon by performing RTA or high-temperature thermal treatment using a furnace on the overall surface of the resultant. Thus, a titanium silicide layer is formed on the surfaces of the exposed $N^+$ and $P^+$ gates 202 and 204, $N^+$ and $P^+$ active regions 206 and 208, and the offset area 205. Silicidation takes place on the overall surface of the active regions because with no ion-implantation of the $N^+$ and $P^+$ dopants in the offset area 105, there exists no area having an increased dopant concentration, leaving no unreacted titanium.

Then, stripping is performed to selectively remove the unreacted titanium, using an etchant which does not damage the titanium silicide layer, the silicon substrate, and the gate insulating layer. According to the present invention, there is no unreacted titanium because of the presence of the offset area 205 between the $N^+$ gate 202 and the $P^+$ gate 204, and the titanium silicide layer is present on the overall surface of the active regions after the stripping.

In the above embodiment of the present invention, the existence of the offset area 205 between the $N^+$ gate 202 and the $P^+$ gate 204 prevents inter-diffusion between the $N^+$ and $P^+$ dopants during a subsequent thermal treatment and, as a result, a threshold voltage shift is prevented. Further, a silicide layer is not damaged and thus a stable gate sheet resistance can be ensured since no area having both the $N^+$ and $P^+$ dopants ion-implanted therein is produced despite misalignment during photography processes for forming the $N^+$ gate 202 and the $P^+$ gate 204.

In the present invention as described above, an offset area is formed to space active regions or gates of opposite conductivity types from each other. Therefore, with the offset area avoiding ion-implantation of dopants of different conductivity types, there exists no area having an increased dopant concentration, and thus reliable silicidation can be achieved.

While the present invention has been described in detail with reference to the specific preferred embodiments, they are mere exemplary applications. Thus, it is to be clearly understood that many variations can be made by anyone skilled in the art within the scope and spirit of the present invention.

What is claimed is:

1. A semiconductor device comprising:
    a layer of silicon;
    a first region of said silicon layer having n-type dopants in a certain concentration, said first region being located at the surface of said layer of silicon so as to constitute an n-type region of silicon at said surface;
    a second region of said silicon layer having p-type dopants in a certain concentration, said second region being located at the surface of said layer of silicon so as to constitute a p-type region of silicon at said surface, the p-type region of silicon being laterally offset from the n-type region of silicon;
    a third region of said silicon laver extending vertically in-between said p-type region and said n-type region and thereby spacing said p-type region and said n-type region laterally from one another, the highest of said concentrations of dopants of said p-type and n-type regions being greater than that of said third region; and
    a silicide layer extending directly on the first, second and third regions of silicon, the silicide layer electrically conductively connecting the first and second regions.

2. The semiconductor device of claim 1, wherein the third region of said silicon layer is constituted by non-doped silicon.

3. The semiconductor device of claim 1, wherein the third region of said silicon layer is constituted by silicon having one of n-type and p-type dopants in a concentration less than that of one of the first and second active regions of silicon.

4. The semiconductor device of claim 1, wherein the first and second regions of silicon each serve as a gate of a transistor.

5. The semiconductor device of claim 3, wherein said layer of silicon is a well in a semiconductor substrate, said well having the p-type and n-type regions of silicon disposed therein, whereby said third region of silicon is a portion of said well.

* * * * *